(12) United States Patent
Hojo et al.

(10) Patent No.: US 7,449,276 B2
(45) Date of Patent: *Nov. 11, 2008

(54) POSITIVE PHOTORESIST COMPOSITION AND METHOD FOR FORMING RESIST PATTERN

(75) Inventors: Takuma Hojo, Kawasaki (JP); Kiyoshi Ishikawa, Kawasaki (JP); Tsuyoshi Nakamura, Kawasaki (JP); Tasuku Matsumiya, Kawasaki (JP)

(73) Assignee: Tokyo Ohka Kogyo Co., Ltd., Kawasaki-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/554,380

(22) PCT Filed: Apr. 22, 2004

(86) PCT No.: PCT/JP2004/005804

§ 371 (c)(1), (2), (4) Date: Sep. 29, 2006

(87) PCT Pub. No.: WO2004/097526

PCT Pub. Date: Nov. 11, 2004

(65) Prior Publication Data

US 2007/0042288 A1    Feb. 22, 2007

(30) Foreign Application Priority Data

Apr. 30, 2003    (JP) .............................. 2003-125241

(51) Int. Cl.
G03F 7/004    (2006.01)
G03F 7/039    (2006.01)

(52) U.S. Cl. ..................... 430/270.1; 430/905; 430/910

(58) Field of Classification Search ............... 430/270.1, 430/285.1, 326, 905, 910
See application file for complete search history.

(56) References Cited

U.S. PATENT DOCUMENTS

| | | | |
|---|---|---|---|
| 6,033,828 A | 3/2000 | Shimada et al. | |
| 6,239,231 B1 | 5/2001 | Fujishima et al. | |
| 6,228,552 B1 | 9/2001 | Palmgren | |
| 6,495,306 B2 | 12/2002 | Uetani et al. | |
| 6,495,307 B2 | 12/2002 | Uetani et al. | |
| 6,511,785 B1 | 1/2003 | Takemura et al. | |
| 6,511,794 B1 | 1/2003 | Furukawa | |
| 6,579,657 B1 * | 6/2003 | Ishibashi et al. | ......... 430/270.1 |
| 6,593,056 B2 | 7/2003 | Takeda et al. | |
| 6,627,381 B1 | 9/2003 | Uetani et al. | |
| 6,630,282 B2 | 10/2003 | Oomori et al. | |
| 6,787,282 B2 | 9/2004 | Sato | |
| 6,949,329 B2 | 9/2005 | Endo et al. | |
| 6,953,651 B2 | 10/2005 | Namba et al. | |
| 7,312,014 B2 | 12/2007 | Maesawa et al. | |
| 2001/0044070 A1 | 11/2001 | Uetani et al. | |
| 2002/0068238 A1 | 6/2002 | Hada et al. | |
| 2003/0113661 A1 | 6/2003 | Uetani et al. | |
| 2003/0232273 A1 | 12/2003 | Adams et al. | |
| 2004/0033438 A1 | 2/2004 | Hamada et al. | |
| 2005/0031984 A1 | 2/2005 | Takata et al. | |
| 2005/0042541 A1 * | 2/2005 | Hagihara et al. | ......... 430/270.1 |
| 2006/0240355 A1 * | 10/2006 | Ando | ....................... 430/270.1 |
| 2006/0247346 A1 | 11/2006 | Hojo et al. | |
| 2006/0251986 A1 * | 11/2006 | Sato et al. | ................ 430/270.1 |

FOREIGN PATENT DOCUMENTS

| | | |
|---|---|---|
| EP | 1357428 A1 | 10/2003 |
| GB | 2356258 A | 5/2001 |
| JP | 08-254820 | 10/1996 |
| JP | H10-142799 | 5/1998 |
| JP | 10-268508 | 10/1998 |
| JP | 11-002902 | 1/1999 |
| JP | H11-109631 | 4/1999 |
| JP | H11-119443 | 4/1999 |
| JP | 2000-26535 | 1/2000 |
| JP | 2000-214587 | 8/2000 |

(Continued)

OTHER PUBLICATIONS

International Search Report from priority PCT application serial No. PCT/JP 2004/005804.

(Continued)

*Primary Examiner*—Cynthia H. Kelly
*Assistant Examiner*—Anca Eoff
(74) *Attorney, Agent, or Firm*—Knobbe, Martens Olson & Bear LLP

(57) ABSTRACT

The invention provides a positive photoresist composition which exhibits a high level of etching resistance and attains high resolution, and enables the formation of a fine pattern using an electron beam exposure step, as well as a method for forming a resist pattern that uses the positive photoresist composition. This positive photoresist composition for use with EB contains a resin component (A) that exhibits increased alkali solubility under the action of acid, an acid generator component (B) that generates acid on exposure, and an organic solvent (C), wherein the component (A) comprises a copolymer containing a first structural unit (a1) derived from hydroxystyrene and a second structural unit (a2) derived from a (meth)acrylate ester having an alcoholic hydroxyl group, and a portion of the hydroxyl groups of the structural units (a1) and the alcoholic hydroxyl groups of the structural units (a2) are protected with acid dissociable, dissolution inhibiting groups.

12 Claims, No Drawings

FOREIGN PATENT DOCUMENTS

| | | |
|---|---|---|
| JP | 2001-056558 | 2/2001 |
| JP | 2001-142199 | 5/2001 |
| JP | 2001-168478 | 6/2001 |
| JP | 2001-274062 | 10/2001 |
| JP | 2002-6501 | 1/2002 |
| JP | 2002-062655 | 2/2002 |
| JP | 2002-062656 | 2/2002 |
| JP | 2002-169292 | 6/2002 |
| JP | 2002-241442 | 8/2002 |
| JP | 2002-323768 | 11/2002 |
| JP | 2003-075998 | 3/2003 |
| JP | 2003-107707 | 4/2003 |
| JP | 2003-107710 | 4/2003 |
| JP | 2003-295444 | 10/2003 |
| JP | 2003-321520 | 11/2003 |
| JP | 2004-078153 | 3/2004 |
| JP | 2004-333549 | 11/2004 |
| WO | WO 00/46640 | 8/2000 |
| WO | WO 01/73512 A1 | 4/2001 |
| WO | WO 03/007079 | 1/2003 |

OTHER PUBLICATIONS

Office Action dated Nov. 29, 2006 for the counterpart Korean Patent Application No. 10-2005-7019928.

Office Action issued on Jul. 1, 2008, on the Japanese Patent Application No. 2004-142581.

Nakamura et al., "Ultra Thin Film Resists for Low Energy E-beam Projection Lithography", Journal of Photopolymer Science and Technology, vol. 15, No. 3, pp. 417-422, (2002).

Yoshizawa et al., "Comparative study of resolution limiting factors in electron beam lithography using the edge roughness evaluation method", Journal of Vacuum Science and Technology B, Vol. 19, Issue 6, pp. 2488-2493, (2001).

Office Action Issued on Feb. 19, 2008, on the Japanese Patent Application No. 2003-334029.

Office Action Issued on Feb. 19, 2008, on the Japanese Patent Application No. 2003-347136.

* cited by examiner

POSITIVE PHOTORESIST COMPOSITION AND METHOD FOR FORMING RESIST PATTERN

This application is the U.S. National Phase under 35 U.S.C. §371 of International Application PCT/JP2004/005804, filed Apr. 22, 2004, which claims priority to Japanese Patent Application No. 2003-125241, filed Apr. 30, 2003. The International Application was published under PCT Article 21(2) in a language other than English.

TECHNICAL FIELD

The present invention relates to a positive photoresist composition that can be used favorably in a method for forming a resist pattern that includes an exposure step using an electron beam (hereafter, also abbreviated as EB), as well as a method for forming a resist pattern.

BACKGROUND ART

In recent years, advances in lithography techniques have lead to ongoing, rapid miniaturization of resist patterns. Recently, levels of resolution capable of forming line and space patterns of no more than 100 nm, and isolated patterns of no more than 70 nm, are being demanded.

As the microprocessing technology used for realizing these high resolution levels, exposure methods that use electron beam irradiation have been attracting considerable attention. Positive photoresist compositions that have been proposed as ideal photoresist materials for these methods that include an electron beam exposure step typically employ a polyhydroxystyrene-based resin, in which a portion of the hydroxyl groups have been protected with acid dissociable, dissolution inhibiting groups, as the base resin. Examples of the most commonly used acid dissociable, dissolution inhibiting groups include so-called acetal groups, including chain-like ether groups typified by 1-ethoxyethyl groups, and cyclic ether groups typified by tetrahydropyranyl groups, as well as tertiary alkyl groups typified by tert-butyl groups, and tertiary alkoxycarbonyl groups typified by tert-butoxycarbonyl groups.

(Patent Reference 1)
Japanese Unexamined Patent Application, First Publication No. 2000-227658

However, in microprocessing technology, the formation of high aspect ratio, fine patterns, and particularly line and space patterns of no more than 100 nm, has proven very difficult due to pattern collapse caused by the surface tension of the developing solution. One possible countermeasure involves reducing the thickness of the photoresist film, but if the film thickness is reduced using conventional photoresist compositions, then the etching resistance tends to be inadequate.

DISCLOSURE OF INVENTION

The present invention takes the above problems associated with the conventional technology into consideration, with an object of providing a positive photoresist composition which exhibits a high level of etching resistance, enables a high resolution to be attained, and enables formation of a fine pattern using electron beam exposure, as well as a method for forming a resist pattern that uses the positive photoresist composition.

In order to achieve this object, a positive photoresist composition of the present invention is a positive photoresist composition that is used in a method for forming a resist pattern that includes an exposure step using an electron beam, and includes a resin component (A) which exhibits increased alkali solubility under the action of acid, an acid generator component (B) that generates acid on exposure, and an organic solvent (C), wherein the component (A) comprises a copolymer containing a first structural unit (a1) derived from hydroxystyrene and a second structural unit (a2) derived from a (meth)acrylate ester having an alcoholic hydroxyl group, and a portion of the hydroxyl groups of the structural units (a1) and the alcoholic hydroxyl groups of the structural units (a2) are protected with acid dissociable, dissolution inhibiting groups.

Furthermore, the present invention also provides a method for forming a resist pattern that includes the steps of applying a positive photoresist composition of the present invention to a substrate, conducting a prebake, performing selective exposure using an electron beam, and then conducting post exposure baking (PEB), and performing alkali developing to form the resist pattern.

In this description, the term "(meth)acrylate" is a generic term that covers both methacrylate and acrylate. The term "structural unit" refers to a monomer unit that contributes to the formation of a polymer.

Furthermore, the term "exposure" also includes irradiation with an electron beam.

BEST MODE FOR CARRYING OUT THE INVENTION

As follows is a more detailed description of the present invention.

[Positive Photoresist Composition]

A positive photoresist composition of the present invention includes a resin component (A), which contains acid dissociable, dissolution inhibiting groups, and exhibits increased alkali solubility under the action of acid, and an acid generator component (B) that generates acid on exposure.

Regarding the component (A), the action of acid generated from the aforementioned component (B) by exposure causes the acid dissociable, dissolution inhibiting groups to dissociate, causing the entire component (A) to change from an alkali insoluble state to an alkali soluble state.

As a result, when a resist is exposed through a mask pattern during the formation of a resist pattern, or alternatively, is exposed and then subjected to post exposure baking, the exposed portions of the resist shift to an alkali soluble state, whereas the unexposed portions remain insoluble in alkali, meaning that alkali developing can then be used to form a positive resist pattern.

[Resin Component (A)]

The resin component (A) of the present invention must be a copolymer containing a first structural unit (a1) derived from hydroxystyrene and a second structural unit (a2) derived from a (meth)acrylate ester having an alcoholic hydroxyl group as the essential structural units, wherein a portion of the hydroxyl groups of the structural units (a1) and the alcoholic hydroxyl groups of the structural units (a2) are protected with acid dissociable, dissolution inhibiting groups.

This copolymer may also be a copolymer that contains an additional third structural unit (a3) derived from styrene, in addition to the first structural unit (a1) and the second structural unit (a2).

First Structural Unit (a1)

The first structural unit (a1) of the component (A) is a structural unit derived from a hydroxystyrene, and is represented by a general formula (I) shown below. In this description, the name hydroxystyrene describes both the literal hydroxystyrene, as well as α-methylhydroxystyrene.

In the first structural unit (a1) represented by the general formula (I) shown below, the bonding position of the hydroxyl group may be the o-position, the m-position, or the p-position, although from the viewpoints of availability and cost, the p-position is preferred.

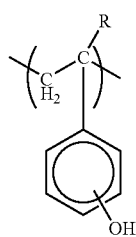

(I)

(wherein, R represents a hydrogen atom or a methyl group)

Second Structural Unit (a2)

The second structural unit (a2) of the component (A) is a structural unit derived from a (meth)acrylate ester having an alcoholic hydroxyl group.

Because the (a2) unit exhibits a lower solubility in alkali developing solutions than a hydroxystyrene unit, the component (A) of the present invention has a lower solubility in alkali developing solutions, with the acid dissociable, dissolution inhibiting groups dissociated, than conventional resins in which a portion of the hydroxyl groups of a polyhydroxystyrene have been protected with acid dissociable, dissolution inhibiting groups, with the acid dissociable, dissolution inhibiting groups dissociated. Accordingly, the component (A) enables a satisfactory degree of insolubility in the alkali developing solution to be achieved with a protection ratio that is lower than that of conventional polyhydroxystyrene-based resins, meaning developing defects caused by the acid dissociable, dissolution inhibiting groups can be suppressed, and higher levels of resolution can be achieved.

In other words, in the present invention, the hydroxystyrene units are replaced with structural units of poorer alkali solubility, in which alcoholic hydroxyl groups have been introduced into a portion of the base resin side chains, thereby reducing the solubility of the resin in alkali developing solutions. Accordingly, provided the second structural unit (a2) of the present invention displays this action, then there are no particular restrictions on the structural unit, and any structural unit derived from a (meth)acrylate ester having an alcoholic hydroxyl group can be used. However, structural units derived from (meth)acrylate esters containing an aliphatic polycyclic group having an alcoholic hydroxyl group display particularly superior resolution and dry etching resistance, and are consequently preferred as the structural unit (a2).

Examples of the polycyclic group that constitutes the aliphatic polycyclic group having an alcoholic hydroxyl group include groups in which one hydrogen atom has been removed from a bicycloalkane, tricycloalkane or tetracycloalkane or the like. Specific examples include groups in which one hydrogen atom has been removed from a polycycloalkane such as adamantane, norbornane, isobornane, tricyclodecane or tetracyclododecane. These types of polycyclic groups can be appropriately selected from the multitude of groups proposed for use with conventional ArF resists. Of these groups, adamantyl groups, norbornyl groups, and tetracyclododecanyl groups are preferred industrially.

As the second structural unit (a2), structural units derived from (meth)acrylate esters containing an adamantyl group having at least one alcoholic hydroxyl group, as represented by a general formula (II) shown below, can be particularly favorably employed.

Of the second structural units (a2) represented by the general formula (II) shown below, structural units represented by a general formula (IIa) shown below are the most desirable.

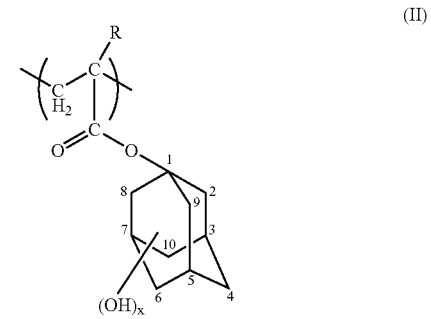

(II)

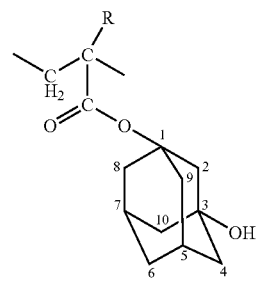

(IIa)

(wherein, R represents a hydrogen atom or a methyl group, and x represents an integer from 1 to 3)

Furthermore, of the possible second structural units (a2), because structural units derived from acrylate esters exhibit a higher solubility in alkali developing solutions than structural units derived from methacrylate esters, once the acid dissociable, dissolution inhibiting groups have been dissociated, they enable the protection ratio of the acid dissociable, dissolution inhibiting groups to be increased, thus improving the contrast. Accordingly, using a structural unit derived from an acrylate ester having an alcoholic hydroxyl group as the structural unit (a2) suppresses developing defects while improving the resolution, and is consequently preferred. At least 80 mol % of the structural units (a2) are preferably structural units derived from an acrylate ester having an alcoholic hydroxyl group, with a value of 100 mol % being the most desirable.

Acid Dissociable, Dissolution Inhibiting Groups

In the component (A), a portion of the hydroxyl groups of the first structural units (a1) and the alcoholic hydroxyl groups of the second structural units (a2) must be protected with acid dissociable, dissolution inhibiting groups.

As the acid dissociable, dissolution inhibiting groups, any of the multitude of acid dissociable, dissolution inhibiting groups proposed for use with conventional chemically amplified KrF positive photoresist compositions or ArF positive photoresist compositions can be selected and used, and specific examples include chain-like or cyclic tertiary alkyl groups such as tert-butyl groups, tert-amyl groups, 1-methylcyclopentyl groups, 1-ethylcyclopentyl groups, 1-methylcyclohexyl groups, and 1-ethylcyclohexyl groups, cyclic ether groups such as tetrahydropyranyl groups and tetrahydrofuranyl groups, and 1-lower alkoxyalkyl groups represented by a general formula (III) shown below, in which the 1-position is substituted with a straight-chain, branched, or cyclic alkoxy group of 1 to 8 carbon atoms. Of these groups, 1-lower alkoxyalkyl groups represented by the general formula (III) are particularly preferred. Specific examples of these groups include straight-chain and branched alkoxyalkyl groups such as 1-ethoxyethyl groups and 1-isopropoxyethyl groups, and cyclic alkoxyalkyl groups such as 1-cyclohexyloxyethyl groups, and of these, 1-ethoxyethyl groups are particularly desirable as they provide excellent resolution.

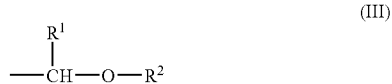

(III)

(wherein $R^1$ represents an alkyl group of 1 to 4 carbon atoms, and $R^2$ represents either a straight-chain or branched alkyl group of 1 to 8 carbon atoms, or a cycloalkyl group of 5 to 7 carbon atoms)

In the present invention, the protection ratio for the hydroxyl groups within the component (A) is typically at least 10 mol % but no more than 35 mol %, and preferably at least 20 mol % but no more than 30 mol %, of the combined total of hydroxyl groups within the first structural units (a1) and alcoholic hydroxyl groups within the second structural units (a2).

If the hydroxyl group protection ratio exceeds the above range, then developing defects become more likely, whereas if the ratio is less than above range, deterioration in the resolution increases.

There are no particular restrictions on the respective protection ratios for the hydroxyl groups of the first structural unit (a1), and the alcoholic hydroxyl groups of the second structural unit (a2), although resins in which either only the hydroxyl groups of the first structural unit (a1) (the hydroxystyrene phenolic hydroxyl groups) are protected, or resins in which both the hydroxyl groups of the first structural unit (a1) and the alcoholic hydroxyl groups of the second structural unit (a2) are protected by the acid dissociable, dissolution inhibiting groups, are preferred.

Furthermore, although dependent on the acid dissociable, dissolution inhibiting groups used, the case in which both the hydroxyl groups of (a1) and the alcoholic hydroxyl groups of (a2) are protected by the acid dissociable, dissolution inhibiting groups is usually the most preferred.

Third Structural Unit (a3)

The third structural unit (a3) of the component (A) is a structural unit derived from styrene, and is represented by a general formula (IV) shown below. In other words, in this description the name styrene describes an alkyl-substituted styrene, the literal styrene, or α-methylstyrene.

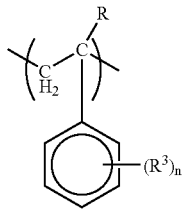

(IV)

(wherein, R represents a hydrogen atom or a methyl group, $R^3$ represents an alkyl group of 1 to 5 carbon atoms, and n represents either 0, or an integer from 1 to 3)

In the component (A), the molar ratio between the structural units (a1) and the structural units (a2), prior to protection with the acid dissociable, dissolution inhibiting groups, namely, the ratio first structural units: second structural units, is preferably within a range from 95:5 to 75:25, and even more preferably from 82:18 to 78:22. If the proportion of the second structural units (a2) exceeds the above range, then the solubility of the resin within the developing solution is inadequate, whereas if the proportion is too small, the effect achieved by using the second structural units is not adequately manifested.

Furthermore, in the component (A), the combination of the first structural units (a1) and the second structural units (a2) within the copolymer, prior to protection with the acid dissociable, dissolution inhibiting groups, preferably accounts for at least 90 mol % of the entire component (A), because if the proportion falls below this value, the resolution tends to deteriorate. The proportion of the copolymer accounted for by the combination of the first structural units (a1) and the second structural units (a2) is even more preferably 95 mol % or greater, and is most preferably 100 mol %.

In the present invention, the third structural unit (a3) is not essential, although incorporating the third structural unit provides certain benefits such as improving the depth of focus, and improving the dry etching resistance. If a third structural unit (a3) is used, then it preferably accounts for 0.5 to 10 mol %, and even more preferably from 2 to 5 mol %, of the structural units used for forming the component (A). If the quantity of the third structural unit (a3) exceeds the above range, then the solubility of the component (A) in the developing solution tends to deteriorate.

In a copolymer comprising the first structural unit (a1) and the second structural unit (a2) as essential structural units, the weight average molecular weight (the polystyrene-equivalent value, this also applies to all subsequent molecular weight values) of the copolymer, prior to protection of a portion of the hydroxyl groups with acid dissociable, dissolution inhibiting groups, is preferably at least 2,000 but no more than 8,500, and is even more preferably at least 4,500 but no more than 8,500. If the weight average molecular weight exceeds 8,500, then the generation of microbridges becomes increasingly likely, whereas if the weight average molecular weight is less than 2,000, the etching resistance and heat resistance tend to deteriorate.

In this description, the term "microbridge" describes a type of developing defect, where in a line and space pattern, for example, portions of adjacent resist patterns near the surface of the pattern are linked together via a bridge formed from the photoresist.

Microbridges are increasingly likely for higher weight average molecular weight values, and for higher temperatures within post exposure baking (PEB).

Furthermore, prior to protection of a portion of the hydroxyl groups with acid dissociable, dissolution inhibiting groups, the copolymer is preferably a monodisperse system with a low polydispersity (Mw/Mn ratio), as this provides superior resolution. Specifically, the polydispersity is typically no more than 2.0, and preferably 1.7 or less.

The resin component (A) can be produced, for example, by copolymerizing a monomer corresponding with (a1) in which the hydroxyl group is not protected, and a monomer corresponding with (a2) in which the hydroxyl group is not protected, and then using a known method to protect a portion of the hydroxyl groups of the (a1) units and/or (a2) units with acid dissociable, dissolution inhibiting groups.

Furthermore, the resin component (A) can also be produced by preparing a monomer corresponding with (a1), in which the hydroxyl group has been protected with an acid dissociable, dissolution inhibiting group, copolymerizing this monomer with a monomer corresponding with (a2) using normal methods, and then using hydrolysis to change a portion of the hydroxyl groups that have been protected with acid dissociable, dissolution inhibiting groups back to hydroxyl groups, and where necessary, using normal methods to protect a portion of the hydroxyl groups of (a2) with acid dissociable, dissolution inhibiting groups.

The quantity of the resin component (A) within a positive photoresist composition of the present invention can be adjusted in accordance with the thickness of the photoresist film that is to be formed. Reported as a solid fraction concentration, the quantity is typically within a range from 5 to 20% by weight, and even more preferably from 7 to 15% by weight.

[Acid Generator Component (B)]

As the acid generator component (B), a compound appropriately selected from known materials used as acid generators in conventional chemically amplified photoresists can be used.

Of the possible acid generators, onium salts containing a fluorinated alkylsulfonate ion as the anion, and oxime sulfonate compounds are preferred.

Specific examples of suitable onium salts include diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, triphenylsulfonium nonafluorobutanesulfonate, (4-trifluoromethylphenyl)diphenylsulfonium trifluoromethanesulfonate, (4-trifluoromethylphenyl)diphenylsulfonium nonafluorobutanesulfonate, and tri(p-tert-butylphenyl)sulfonium trifluoromethanesulfonate.

Specific examples of suitable oxime sulfonate-based compounds include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile. Of these, α-(methylsulfonyloxyimino)-p-methoxyphenylacetonitrile is preferred.

As the component (B), either a single acid generator or a combination of two or more different acid generators may be used.

The quantity used of the component (B) is typically within a range from 0.5 to 30 parts by weight, and preferably from 1 to 10 parts by weight, per 100 parts by weight of the component (A). If the quantity is less than 0.5 parts by weight, then there is a danger that pattern formation may not progress satisfactorily, whereas if the quantity exceeds 30 parts by weight, it becomes difficult to achieve a uniform solution, and there is also a danger of a deterioration in the storage stability of the composition.

[Organic Solvent (C)]

A positive photoresist composition according to the present invention can be produced by dissolving the materials in an organic solvent (C).

The organic solvent (C) may be any solvent capable of dissolving each of the components used to generate a uniform solution, and one or more solvents selected from known materials used as the solvents for conventional chemically amplified photoresists can be used.

Suitable examples include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used alone, or as a mixed solvent of two or more different solvents.

There are no particular restrictions on the quantity used of the organic solvent (C), which is selected to yield a concentration that can make the resist composition be applied to a substrate or the like. The quantity of the organic solvent (C) is selected so that the solid fraction concentration (the combined total of the component (A), the component (B), the optional components (D) and (E) described below, and any other optional components) for the positive resist composition is within a range from 3 to 30% by weight, and the actual quantity is set in accordance with the film thickness of the resist.

[Nitrogen-Containing Organic Compound (D)]

In a positive photoresist composition of the present invention, in order to improve the resist pattern shape and the post exposure stability of the latent image formed by the pattern-wise exposure of the resist layer, a nitrogen-containing organic compound can also be added as a separate, optional component (D).

A multitude of these nitrogen-containing organic compounds have already been proposed, and any of these known compounds can be used, although a secondary aliphatic amine or tertiary aliphatic amine is preferred. Here, an aliphatic amine refers to an alkyl or alkylalcohol amine.

Specific examples of the component (D) include alkyl amines such as trimethylamine, diethylamine, triethylamine, di-n-propylamine, tri-n-propylamine, tripentylamine, tri-n-heptylamine, tri-n-octylamine, di-n-heptylamine, di-n-octylamine, and tri-n-dodecylamine; and alkylalcohol amines such as diethanolamine, triethanolamine, triisopropanolamine, di-n-octanolamine, and tri-n-octanolamine. Of these, secondary or tertiary aliphatic amines containing an alkyl group of 7 to 15 carbon atoms are preferred. By ensuring that the component contains an alkyl group of 7 to 15 carbon atoms, the dispersion of the aliphatic amine through the resist pattern is suppressed, enabling a more uniform distribution, and enabling formation of a fine resist pattern with a favorable profile. In the present invention, alkyl amines such as tri-n-octylamine are particularly preferred.

The component (D) may be used alone, or in combinations of two or more different compounds.

This component (D) is typically added in a quantity within a range from 0.01 to 2.0 parts by weight per 100 parts by weight of the component (A).

Furthermore, in order to prevent any deterioration in sensitivity caused by the addition of the aforementioned component (D), and improve the resist pattern shape and the post exposure stability of the latent image formed by the patternwise exposure of the resist layer, an organic carboxylic acid, or a phosphorus oxo acid or derivative thereof can also be added as another optional component (E). The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

[Other Optional Components]

Other miscible additives can also be added to a positive photoresist composition of the present invention according to need, and examples include additive resins for improving the properties of the photoresist film, surfactants for improving the ease of application, dissolution inhibitors, plasticizers, stabilizers, colorants, and halation prevention agents.

A photoresist composition of the present invention exhibits superior etching resistance and resolution to conventional chemically amplified positive photoresist compositions that use a polyhydroxystyrene-based resin. Accordingly, the thickness of the photoresist film can be reduced, and even if the resist pattern is very fine, by reducing the thickness of the photoresist film, the aspect ratio can be reduced, enabling prevention of pattern collapse. As a result, the composition can be used effectively in a process for forming a resist pattern that includes an electron beam (EB) exposure step, which is ideal for microprocessing.

[Method for Forming Resist Patterns]

A method for forming a resist pattern according to the present invention can be conducted, for example, in the manner described below.

Namely, a positive photoresist composition described above is first applied to the surface of a substrate such as a silicon wafer using a spinner or the like, and a prebake is then conducted under temperature conditions of 80 to 150° C. for 40 to 120 seconds, and preferably for 60 to 90 seconds, thus forming a photoresist film. In the present invention, the film thickness of this photoresist film can be reduced to approximately 200 nm, and is preferably at least 200 nm but less than 400 nm.

Subsequently, this photoresist film is either exposed with an electron beam through a desired mask pattern, or patterned directly with an electron beam without using a mask.

PEB (post exposure baking) is then conducted under temperature conditions of 80 to 150° C. for 40 to 120 seconds, and preferably for 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

Furthermore, a positive photoresist composition of the present invention can also be used favorably in a method for forming a resist pattern that includes a narrowing step that uses a shrink process.

A shrink process is a method in which a resist pattern formed on a substrate is coated with a water soluble resin coating, this water soluble resin coating is then shrunk by subsequent heat treatment, and this heat shrinkage action is used to narrow the spacing in the resist pattern.

More specifically, a coating formation agent containing a water soluble polymer or the like is first applied to the surface of a resist pattern formed on a substrate, preferably forming a laminate in which the water soluble resin coating covers the entire surface of the resist pattern. Following application of the coating formation agent, a prebake may be conducted at a temperature of 80 to 100° C. for a period of 30 to 90 seconds.

Subsequently, the thus obtained laminate is subjected to heat treatment, causing the water soluble resin coating to undergo heat shrinkage. As a result of this heat shrinkage of the water soluble resin coating, the side walls of the resist patterns in contact with the water soluble resin coating are pulled together, thereby narrowing the spacing between patterns. This resist pattern spacing determines the final pattern size (the hole diameter within a hole pattern or the width within a line and space pattern), and consequently the heat shrinkage of the water soluble resin coating is able to narrow the pattern size, enabling miniaturization of the resist pattern.

The heating temperature is set to the temperature required to achieve shrinkage of the water soluble resin coating, and there are no particular restrictions on this temperature provided satisfactory narrowing of the pattern size can be achieved, although the heating is preferably conducted at a temperature that is lower than the softening point of the resist pattern. Conducting the heat treatment at this type of temperature is extremely beneficial, as it enables a pattern with a good profile to be formed more effectively, and also reduces the pitch dependency of the degree of narrowing within the substrate plane, that is, the degree to which the level of narrowing is dependent on the pattern size within the substrate plane.

The "softening point of the resist pattern" refers to the temperature at which the resist pattern formed on the substrate begins to flow spontaneously during heat treatment of the substrate. The softening point of the resist pattern varies depending on the photoresist composition used to form the resist pattern. Taking into consideration the softening points of the various photoresist compositions used in current photolithography techniques, a preferred heat treatment is typically conducted at a temperature within a range from 80 to 160° C., at a temperature that does not cause fluidization of the photoresist, for a period of 30 to 90 seconds.

The thickness of the water soluble resin coating is preferably either approximately equal to the height of the resist pattern, or of a height sufficient to cover the resist pattern, and is typically within a range from 0.1 to 0.5 µm.

Subsequently, the heat shrunk water soluble resin coating, which still remains on the pattern, is removed by washing with an aqueous solvent, and preferably with pure water, for 10 to 60 seconds. The water soluble resin coating is easily removed by washing with water, and is able to be completely removed from the substrate and the resist pattern.

There are no particular restrictions on the water soluble polymer contained within the coating formation agent used to form the water soluble resin coating, provided the polymer is soluble in water at room temperature, although resins containing structural units derived from at least one monomer which acts as a proton donor, and structural units derived from at least one monomer which acts as a proton acceptor are ideal. By using this type of resin, volumetric shrinkage can be favorably carried out by heating.

This type of water soluble polymer may either be a copolymer containing structural units derived from at least one monomer which acts as a proton donor, and structural units derived from at least one monomer which acts as a proton acceptor, or a mixture of a polymer with structural units derived from at least one monomer which acts as a proton donor, and a polymer with structural units derived from at least one monomer which acts as a proton acceptor. However, when co-solubility is taken into consideration, a copolymer is preferably used as the water soluble polymer.

From an industrial viewpoint, this water soluble polymer is preferably an acrylic-based polymer, a vinyl-based polymer, a cellulose derivative, an alkylene glycol-based polymer, a urea-based polymer, a melamine-based polymer, an epoxy-based polymer or an amide-based polymer.

Of these, a composition containing at least one polymer selected from a group consisting of alkylene glycol-based polymers, cellulose-based polymers, vinyl-based polymers and acrylic-based polymers is preferred, and acrylic resins are the most preferred as they also offer simple pH adjustment. In addition, using a copolymer of an acrylic-based polymer and another non-acrylic water soluble polymer is preferred, as such copolymers enable efficient narrowing of the resist pattern size, while maintaining the shape of the resist pattern during the heat treatment. The water soluble polymer may be either a single polymer, or a mixture of two or more polymers.

The monomer which acts as a proton donor is preferably acrylamide or N-vinylpyrrolidone or the like.

The monomer which acts as a proton acceptor is preferably acrylic acid or the like.

A water soluble polymer containing N-vinylpyrrolidone as the proton donor monomer and acrylic acid as the proton acceptor monomer is particularly preferred.

The coating formation agent preferably also contains a surfactant. There are no particular restrictions on the surfactant, although it should have properties such that when added to the water soluble polymer described above, the solubility is good, a suspension does not develop, and co-solubility with the polymer component is favorable. By using a surfactant that satisfies these types of characteristics, the conventional problem of defects, which are thought to be related to the occurrence of microfoam during the application of the coating material, can be more effectively prevented.

Specifically, one or more surfactants selected from a group consisting of N-alkylpyrrolidone-based surfactants, quaternary ammonium salt-based surfactants, and polyoxyethylene phosphate ester-based surfactants is preferred.

The quantity added of the surfactant is preferably within a range from 0.1 to 10% by weight, and even more preferably from 0.2 to 2% by weight, relative to the total solid fraction of the coating formation agent. Quantities outside the above range can cause a deterioration in the ease of application, resulting in variations in the degree of pattern shrinkage as a result of a decrease in in-plane uniformity, and an increased likelihood of defects, which are thought to be strongly related to the occurrence of fine bubbles known as microfoam that can be generated during application of the coating material.

From the viewpoints of preventing impurities and enabling pH adjustment, the coating formation agent may also contain an optional water soluble amine.

In addition, from the viewpoints of reducing the resist pattern size and suppressing the occurrence of defects, an additional non-amine-based water soluble organic solvent may also be added to the coating formation agent if desired.

The coating formation agent is preferably used in the form of an aqueous solution with a concentration of 3 to 50% by weight, and even more preferably from 5 to 20% by weight. If the concentration is less than 3% by weight, a satisfactory coating may not be formed on the substrate, whereas at concentrations exceeding 50% by weight, not only does increasing the concentration not produce an equivalent improvement in the desired effects, but the handling of the agent also becomes more difficult.

As described above, the coating formation agent is usually used in the form of an aqueous solution using water as the solvent, although a mixed solvent of water and an alcohol-based solvent can also be used. Examples of this alcohol-based solvent include monovalent alcohols such as methyl alcohol, ethyl alcohol, propyl alcohol, and isopropyl alcohol. The alcohol-based solvent is added to the water in quantities of no more than 30% by weight.

EXAMPLES

As follows is a more detailed description of the present invention, using a series of examples.

Example 1

First, the component (A) was prepared. Namely, a copolymer of p-hydroxystyrene and adamantanol acrylate, which is the compound of the above general formula (IIa) in which R is a hydrogen atom, (molar ratio: 80:20, weight average molecular weight (Mw): 7,700, polydispersity (Mw/Mn): 1.5) and ethyl vinyl ether were reacted together by normal methods in the presence of an acid catalyst, thus forming a resin (A1) in which the hydroxyl groups of the copolymer had been protected with 1-ethoxyethyl groups.

When this resin (A1) was analyzed by $^1$H-NMR, the quantity of 1-ethoxyethyl groups relative to the total number of hydroxyl groups from p-hydroxystyrene and adamantanol was 27%. This indicates a protection ratio for the hydroxyl groups of 27 mol %.

Using this resin (A1) as the component (A), 100 parts by weight of this component (A), 6.0 parts by weight of triphenylsulfonium trifluoromethanesulfonate as the component (B), 0.5 parts by weight of trioctylamine as the component (D), 0.2 parts by weight of salicylic acid, and 0.05 parts by weight of a non-ionic fluorine-silicone based surfactant (brand name: MEGAFAC R-08 (manufactured by Dainippon Ink and Chemicals, Incorporated)) were dissolved in 1300 parts by weight of propylene glycol monomethyl ether acetate (hereafter abbreviated as "PM"), thus yielding a positive photoresist composition.

Meanwhile, a substrate was prepared by treating an 8 inch diameter silicon wafer with hexamethyldisilazane.

The positive photoresist composition obtained above was applied to the surface of this substrate using a spinner, and then prebaked and dried on a hotplate at 100° C. for 90 seconds, forming a photoresist layer with a film thickness of 200 nm.

Next, this photoresist layer was exposed using an electron beam lithography apparatus (HL-800D, manufactured by Hitachi, Ltd., accelerating voltage 70 kV), using a method in which the pattern was formed by direct irradiation of the electron beam onto the photoresist layer.

A PEB treatment was then performed at 110° C. for 90 seconds, and the photoresist layer was subjected to puddle development for 60 seconds at 23° C. in a 2.38% by weight aqueous solution of tetramethylammonium hydroxide, and then rinsed with pure water for 30 seconds. The resist was then shaken dry, and then further dried by heating at 100° C. for 60 seconds, thus forming a 1:1 line and space resist pattern.

Inspection of the thus obtained resist pattern using a SEM (scanning electron microscope) revealed that a line and space pattern of line width 70 nm had been formed with excellent resolution, and no pattern collapse had occurred. Furthermore, when the same procedure was used to form a hole pattern (1:1 dense pattern) with a hole diameter of 80 nm, the resolution was very good.

Subsequently, using the thus formed line and space pattern of line width 70 nm as a mask, an etching rate test was conducted by subjecting the substrate to dry etching. Namely, when the etching rate of the resist pattern was measured using a mixed gas of oxygen and tetrafluoromethane as the etching gas, the etching rate was 1.2 times slower than the rate observed when the comparative example 1 described below was measured under identical conditions, indicating an excellent level of etching resistance.

Furthermore, a photoresist layer with a film thickness of 200 nm was formed by applying the above positive photoresist composition to the surface of a substrate using a spinner, and then conducting prebaking and drying on a hotplate at 100° C. for 90 seconds. Subsequently, a pattern was formed by large area exposure (6 mm x 6 mm) using an electron beam lithography apparatus (HL-800D, manufactured by Hitachi, Ltd., accelerating voltage 70 kV), and when the substrate was then inspected using a surface defect inspection apparatus KLA2132, manufactured by KLA Tencor Corporation, the number of surface defects was no more than 10, confirming that developing defects had been effectively prevented.

Comparative Example 1

A resin component containing poly(p-hydroxystyrene) (weight average molecular weight: 8,000, polydispersity: 1.2) in which a portion of the hydroxyl groups had been protected with 1-ethoxyethyl groups (hydroxyl group protection ratio: 45 mol %) was used instead of the resin (A1) of the component (A) from the example 1. With the exception of using this resin component, a photoresist composition of the comparative example 1 was prepared in the same manner as the example 1.

When the thus obtained photoresist composition was used to form a line and space pattern in the same manner as the example 1, resolution was possible down to a line and space pattern of line width 90 nm.

When the number of surface defects was investigated using the same method as the example 1, the number of defects was so high as to be immeasurable.

Furthermore, when the line and space pattern of line width 90 nm was used as a mask, and an etching rate test was conducted by subjecting the substrate to dry etching in the same manner as the example 1, it was evident that this pattern exhibited a faster etching rate than the example 1 or the example 2 described below, indicating an inferior level of etching resistance.

Example 2

First, the component (A) was prepared. Namely, a copolymer of p-hydroxystyrene and adamantanol methacrylate, which is the compound of the above general formula (IIa) in which R is a methyl group, (molar ratio: 80:20, weight average molecular weight (Mw): 8,000, polydispersity (Mw/Mn): 1.7) and ethyl vinyl ether were reacted together by normal methods in the presence of an acid catalyst, thus forming a resin (A2) in which the hydroxyl groups of the copolymer had been protected with 1-ethoxyethyl groups.

When this resin (A2) was analyzed by $^1$H-NMR, the quantity of 1-ethoxyethyl groups relative to the total number of hydroxyl groups from p-hydroxystyrene and adamantanol was 20%. This indicates a protection ratio for the hydroxyl groups of 20 mol %.

With the exception of using this resin (A2) as the component (A), a photoresist composition was prepared in the same manner as the example 1.

Using the thus obtained photoresist composition, a line and space pattern was formed in the same manner as the example 1.

Inspection of the thus obtained resist pattern using a SEM (scanning electron microscope) revealed that a line and space pattern of line width 70 nm had been formed with excellent resolution, and no pattern collapse had occurred.

Furthermore, when the number of surface defects was investigated using the same method as the example 1, the number was no more than 20.

Furthermore, when the line and space pattern of line width 70 nm was used as a mask, and an etching rate test was conducted by subjecting the substrate to dry etching in the same manner as the example 1, the etching rate of the resist pattern was 1.2 times slower than the rate observed for the comparative example 1, indicating an excellent level of etching resistance.

Example 3

Using the substrate formed in the example 1 that included a hole pattern with a hole diameter of 80 nm, a narrowing step was performed using a shrink process.

Namely, a water soluble resin coating with a total solid fraction concentration of 8.0% by weight, which was formed by dissolving 10 g of a copolymer of acrylic acid and vinylpyrrolidone (acrylic acid: vinylpyrrolidone=2:1 (weight ratio)), and 0.02 g of "SURFADONE LP100" (manufactured by ISP Co., Ltd.) as an N-alkylpyrrolidone-based surfactant in pure water, was applied to the surface of the hole pattern to form a laminate. The film thickness (the height from the surface of the substrate) of the water soluble resin coating of the laminate was 200 nm. The laminate was then subjected to heat treatment for 60 seconds at a temperature of 120° C., and the water soluble resin coating was then removed by washing with pure water at 23° C.

As a result of this treatment, the hole diameter of the hole pattern was reduced to 60 nm, while the vertical shape of the resist pattern retained the favorable shape that existed prior to the heat treatment.

EFFECTS OF THE INVENTION

As described above, according to the present invention there are provided a positive photoresist composition, which exhibits excellent etching resistance and favorable resolution, enables the thickness of the photoresist film to be reduced, and enables formation of a fine pattern using electron beam exposure, as well as a method for forming a pattern that uses the positive photoresist composition.

The invention claimed is:

1. A positive photoresist composition that is used in a method for forming a resist pattern that includes an exposure step using an electron beam, comprising
    a resin component (A) that exhibits increased alkali solubility under action of acid, an acid generator component (B) that generates acid on exposure, and an organic solvent (C), wherein
    said component (A) comprises a copolymer a first structural unit (a1) derived from hydroxystyrene and a second structural unit (a2) derived from a (meth)acrylate ester having an alcoholic hydroxyl group, and a portion of hydroxyl groups of said structural units (a1) and alcoholic hydroxyl groups of said structural units (a2) are protected with acid dissociable, dissolution inhibiting group, wherein
    both the hydroxyl groups of (a1) and the alcoholic hydroxyl groups of (a2) are partially protected by acid dissociable, dissolution inhibiting groups, wherein
    a weight average molecular weight of said copolymer of said resin component (A), prior to protection with said acid dissociable, dissolution inhibiting groups, is at least 2,000 but no more than 8.500.

2. A positive photoresist composition according to claim 1, wherein at least 10 mol % but no more than 35 mol % of a combined total of hydroxyl groups of said structural units (a1) and alcoholic hydroxyl groups of said structural units (a2) are protected with said acid dissociable, dissolution inhibiting groups.

3. A positive photoresist composition according to claim 1, wherein a molar ratio between said structural units (a1) and said structural units (a2) within said resin component (A), prior to protection with said acid dissociable, dissolution inhibiting groups, is within a range from 95:5 to 75:25.

4. A positive photoresist composition according to claim 1, wherein said structural unit (a2) is a structural unit derived from a (meth)acrylate ester containing an aliphatic polycyclic group having an alcoholic hydroxyl group.

5. A positive photoresist composition according to claim 4, wherein said structural unit (a2) is a structural unit derived from a (meth)acrylate ester containing an adamantyl group having an alcoholic hydroxyl group.

6. A positive photoresist composition according to claim 1, wherein said structural units (a2) comprise only structural units derived from acrylate esters having an alcoholic hydroxyl group.

7. A positive photoresist composition according to claim 1, wherein said acid dissociable, dissolution inhibiting group is a 1-lower alkoxyalkyl group.

8. A positive photoresist composition according to claim 1, wherein said copolymer of said resin component (A) further comprises a third structural unit (a3) derived from styrene.

9. A positive photoresist composition according to claim 1, wherein a polydispersity (Mw/Mn ratio) of said copolymer of said resin component (A), prior to protection with said acid dissociable, dissolution inhibiting groups, is no more than 2.0.

10. A positive photoresist composition according to claim 1, further comprising a nitrogen-containing organic compound (D), wherein said component (D) comprises a secondary or tertiary aliphatic amine containing an alkyl group of 7 to 15 carbon atoms.

11. A method for forming a resist pattern, comprising steps of applying a positive photoresist composition according to claim 1 to a substrate, conducting a prebake, performing selective exposure using an electron beam, and then conducting post exposure baking (PEB), and performing alkali developing to form a resist pattern.

12. A method for forming a resist pattern according to claim 11, further comprising a narrowing step, in which a water soluble resin coating comprising a water soluble polymer is provided on top of said resist pattern obtained following alkali developing, and is subsequently heated, causing said water soluble resin coating to shrink, thereby narrowing a spacing of said resist pattern.

* * * * *

UNITED STATES PATENT AND TRADEMARK OFFICE
CERTIFICATE OF CORRECTION

PATENT NO. : 7,449,276 B2  Page 1 of 1
APPLICATION NO. : 10/554380
DATED : November 11, 2008
INVENTOR(S) : Hojo et al.

It is certified that error appears in the above-identified patent and that said Letters Patent is hereby corrected as shown below:

Page 2, Column 1, under "FOREIGN PATENT DOCUMENTS, third entry, change "2001-168478" to --2001-166478--.

Column 15, Line 26, in Claim 1, after "copolymer" insert --containing--.

Column 15, Line 40, in Claim 1, change "8.500" to --8,500--.

Signed and Sealed this

Twenty-eighth Day of July, 2009

JOHN DOLL
*Acting Director of the United States Patent and Trademark Office*